M. S. MEAD, JR

CRYSTAL-CONTROLLED MEANS FOR STABILIZING FREQUENCY OF OSCILLATOR CIRCUIT

Filed Dec. 4, 1945

INVENTOR
MILTON S. MEAD, JR.
BY William D. Hall.
ATTORNEY.

Patented Feb. 7, 1950

2,496,300

UNITED STATES PATENT OFFICE 2,496,300

CRYSTAL-CONTROLLED MEANS FOR STABILIZING FREQUENCY OF OSCILLATOR CIRCUIT

Milton S. Mead, Jr., United States Army, Schenectady, N. Y.

Application December 4, 1945, Serial No. 632,784

10 Claims. (Cl. 250—36)

(Granted under the act of March 3, 1883, as amended April 30, 1928; 370 O. G. 757)

The invention described herein may be manufactured and used by or for the Government for governmental purposes, without the payment of any royalty thereon.

The present invention concerns crystal-controlled means for use in stabilizing the frequency of an oscillator circuit in electronic devices, such as a radio transmitter. It provides a means of reducing greatly those changes in frequency of the oscillations produced by the circuit, which would otherwise result from changes in circuit constants, such as would be caused by voltage and temperature effects or load changes.

Figure 1:
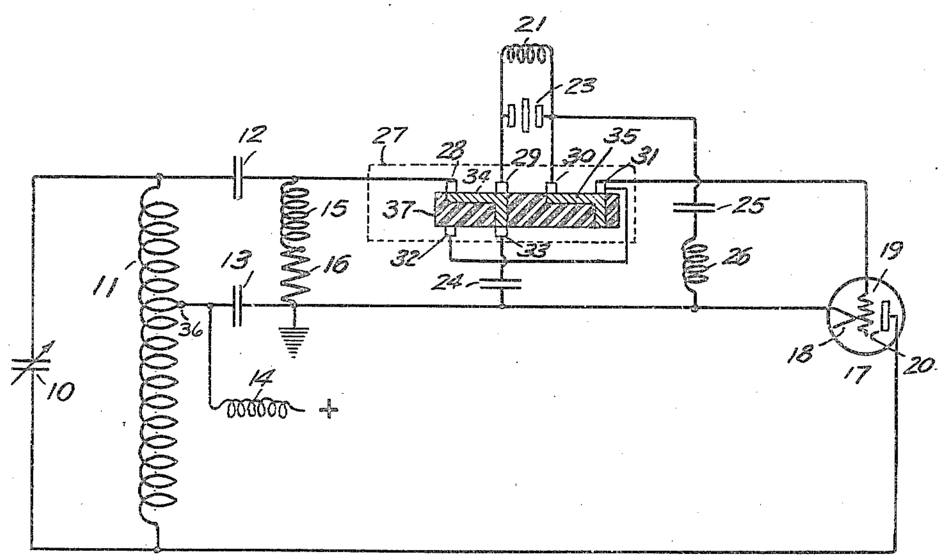

Figure 1 draws the oscillator circuit, with the crystal-controlled means for accomplishing frequency stabilization in operation.

Figure 2:
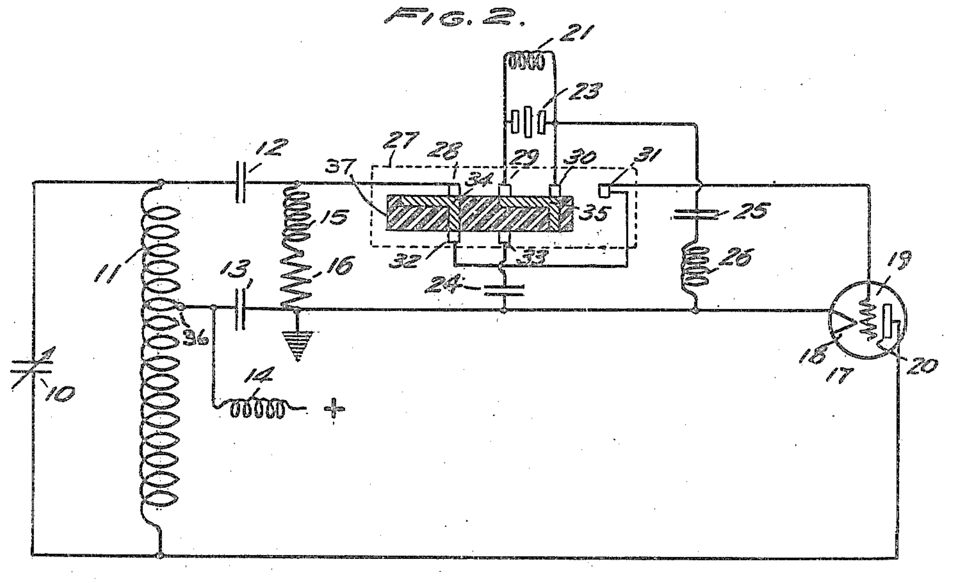

Figure 2 shows the oscillator circuit, with the crystal-controlled means for accomplishing frequency stabilization out of operation.

The crystal-controlled means are inserted in a typical oscillator circuit, of which that illustrated in the drawing is to be considered merely an example. The oscillator circuit as shown consists of a variable condenser 10, an inductance 11 having an intermediate tap 36, two blocking condensers 12 and 13 respectively, two radio-frequency choke coils 14 and 15 respectively, a grid-leak resistance 16, a triode tube 17 having a filament 18, a grid 19 and a plate 20.

The crystal-controlled means consists of a radio-frequency choke coil 21, a crystal 23, a balancing condenser 24, a blocking condenser 25, an inductance 26, and a switch 27. Switch 27, as shown, includes stationary contacts 28, 29, 30, 31, 32 and 33, as well as movable element 37 made of insulating material. Element 37 carries movable contacts 34 and 35. This form of switch is merely illustrative. Other forms may be substituted, or the switch may be omitted completely and the crystal-controlled means left permanently connected to the oscillator circuit.

The frequency of crystal 23 is that of the desired frequency of the oscillating circuit. To avoid damage to the crystal, it is desirable that the only current flowing through the crystal 23 be that required to supply the power loss in the grid 19, and that the capacity current resulting from the grid-filament and grid-plate capacities of tube 17 not pass through crystal 23. This capacity current, which leads the impressed voltage by 90°, is neutralized insofar as crystal 23 is concerned through the use of inductance 26, whose value is so established that at the frequency of the oscillator circuit, it draws a current lagging the impressed voltage by 90° and having a magnitude equal to that of the capacity current.

The use of inductance 26 disturbs the previously-existing tuning of the oscillator circuit. If the circuit has been calibrated at a certain frequency, it may be desirable to restore this previously-existing tuning. This may be done through the addition of a condenser 24 having a capacity such as to restore to the oscillator circuit that current which is in effect removed from the circuit through the addition of inductance 26. If it is not necessary to retain a previously-existing calibration, condenser 24 may be omitted.

When movable element 37 of switch 27 is in the position shown in Fig. 1, the crystal-controlled means are connected to the oscillator circuit, partly through contact of stationary contacts 28 and 29 with movable contact 34, and partly through contact of stationary contacts 30 and 31 with movable contact 35.

It would be possible to remove the crystal-controlled means from the oscillator circuit simply by opening the connections between the circuit and the components making up such means. However, it is advisable to prevent undesirable resonant effects which might occur due to capacitive couplings of the crystal-controlled means to the oscillator circuit. Accordingly switch 27 is so arranged that when its movable element 37 has been shifted to the left, as shown in Fig. 2, to remove the crystal-controlled means from the oscillator circuit, condenser 24 is disconnected from the circuit, while crystal 23 is short-circuited.

The operation of the oscillator circuit with the crystal-controlled means in use is as follows:

If the oscillator circuit is tuned to the natural frequency of crystal 23, the latter has the effect of a small resistance and the voltage drop across it is small and subtracts from the voltage produced by the oscillator circuit. This does not directly affect the frequency or operation of the circuit.

If the oscillator circuit tuning tends to change in the direction of an increase in frequency due to changes in circuit constants which decrease the circuit capacity, crystal 23 acts as an inductance and the voltage drop through the crystal leads the current through it by approximately 90°. This voltage drop subtracts from the voltage produced by the oscillator circuit so as to make the grid voltage more lagging than it had been before the tendency toward change of frequency developed. This phase shift of grid voltage is accomplished even with a very slight change in frequency. It permits oscillations to continue with the plate current and grid voltage in phase, and with the plate current and plate voltage out of phase by an amount equal to the angle the grid voltage is shifted. Thus frequency shift due to changes in tuning of the circuit is greatly reduced.

If the oscillator circuit tuning tends to change in the direction of a decrease in frequency due to changes in circuit constants which increase the circuit capacity, crystal 23 acts as a capacitance and the voltage drop through it lags the current through it by approximately 90°. This voltage drop subtracts from the voltage produced by the oscillator circuit so as to make the grid voltage more leading than had been the case before the tendency toward change of frequency occurred. Again, oscillations continue with the plate current and grid voltage in phase, and with the plate current and plate voltage out of phase to the extent of the phase shift of the grid voltage.

As can be seen from the above description, substantial phase shifts of grid voltage due to changes in circuit constants, may occur in the oscillator circuit, with very minor changes in frequency. Thus frequency stabilization is obtained in spite of changes in circuit constants which might result, for example, from voltage or temperature effects, or load changes. Furthermore, this is accomplished without any need of mechanical operation of tuning means in the oscillator circuit by the crystal-controlled means, and without any movable parts in the latter means. The switch is considered to be additional to the crystal-controlled means and may be omitted, as stated above.

What is claimed is:

1. An electrical frequency control system comprising: generating means for producing electrical oscillations of a predetermined frequency, these generating means including a tank circuit and a vacuum tube having at least a cathode, a grid, and an anode, these generating means also including a series connection between the tank circuit and the grid; in the series connection, piezo-electric crystal means whose resonant frequency is the same as the predetermined frequency; a neutralizing circuit connected to the series connection at a point between the crystal and the grid, this neutralizing circuit drawing from the generating means a lagging current equal to the leading current drawn by the tube, so that the resultant current through the crystal is only that required to supply the tube grid losses; the crystal being responsive through the series connection, to a departure of the frequency of the generating means from its predetermined value, to restore the frequency to such value.

2. An electrical frequency control system, as described in claim 1, in which a radio-frequency choke coil is connected in parallel with the crystal.

3. An electrical frequency control system comprising: generating means for producing electrical oscillations of a predetermined frequency the generating means being calibrated at such frequency, these generating means including a tank circuit and a vacuum tube having at least a cathode, a grid, and an anode, these generating means also including a series connection between the tank circuit and the grid; piezo-electric crystal means whose resonant frequency is the same as the predetermined frequency; switch means which in a first position remove the crystal from and in a second position insert the crystal into the series connection; a normally-open neutralizing circuit connected to the series connection at a point between the crystal and the grid, this neutralizing circuit when closed drawing from the generating means a lagging current equal to the leading current drawn by the tube, so that the resultant current through the crystal is only that required to supply the tube grid losses; a normally-open balancing circuit connected to the series connection at a point between the generating means and the crystal, this balancing circuit when closed drawing from the generating means a leading current equal to the leading current drawn by the tube, thus maintaining the frequency-calibration of the generating means; the switch means in the first position opening and in the second position closing the neutralizing and balancing circuits; and the crystal, when in the series connection, being responsive to a departure of the frequency of the generating means from its predetermined value, to restore the frequency to such value.

4. An electrical frequency control system, as described in claim 1, including switch means which in a first position remove the crystal from the series connection, short-circuit the crystal and open the neutralizing circuit, thus avoiding undesirable resonant effects; and which in a second position insert the crystal in the series connection, remove the short-circuit from the crystal and close the neutralizing circuit.

5. An electrical frequency control system, as described in claim 3, in which the switch means in the first position also short-circuit the crystal, thus avoiding undesirable resonant effects.

6. An electrical frequency control system comprising: generating means for supplying oscillations of a given frequency, these generating means including a tank circuit and a vacuum tube having at least a cathode, a grid, and an anode, these generating means also including a series connection between the tank circuit and the grid; in the series connection, piezo-electric crystal means whose resonant frequency is the same as the predetermined frequency; a neutralizing circuit, one end of which is connected to the series connection at a point between the crystal and the grid, and the other end of which is connected to the cathode, the neutralizing circuit including an inductance of such value that the neutralizing circuit draws from the generating means a lagging current equal to the leading current drawn by the tube, so that the current which passes through the crystal is only large enough to supply the tube grid losses; the crystal being responsive, through the series connection, to restore the frequency of the oscillations to its given value, in the event that it varies from such value.

7. An electrical frequency control system, as described in claim 6, in which a radio-frequency choke coil is connected in parallel with the crystal.

8. An electrical frequency control system comprising: generating means for supplying oscillations of a given frequency, the generating means being calibrated at such frequency, these generating means including a tank circuit and a vacuum tube having at least a cathode, a grid, and an anode, these generating means also including a series connection between the tank circuit and the grid; piezo-electric crystal means whose resonant frequency is the same as the predetermined frequency; switch means which in a first position remove the crystal from and in a second position insert the crystal into the series connection; a normally-open neutralizing circuit, one end of which is connected to the series connection at a point between the crystal and the grid, and the other end of which is connected to the cathode, the neutralizing circuit including an inductance of such value that when the circuit is closed it draws from the generating means a lagging current equal to the leading current drawn by the tube, so that the current which passes through the crystal is only large enough to supply the tube grid losses; a normally-open balancing circuit, one end of which is connected to the series connection at a point between the generating means and the crystal, and the other end of which is connected to the cathode, the balancing circuit including a condenser of such value that when the balancing circuit is closed it draws from the generating means a leading current equal to the leading current drawn by the tube, thus maintaining the frequency calibration of the generating means; the switch means in the first position opening and in the second position closing the neutralizing and balancing circuits; and the crystal, when in the series connection being responsive to restore the frequency of the oscillations to its given value, in the event that it varies from such value.

9. An electrical frequency control system, as described in claim 6, including switch means which in a first position remove the crystal from the series connection, short-circuit the crystal and open the neutralizing circuit, thus avoiding undesirable resonant effects; and which in a second position insert the crystal in the series connection, remove the short-circuit from the crystal and close the neutralizing circuit.

10. An electrical frequency control system, as described in claim 8, in which the switch means in their first position also short-circuit the crystal, thus avoiding undesirable resonant effects.

MILTON S. MEAD, Jr.

REFERENCES CITED

The following references are of record in the file of this patent:

UNITED STATES PATENTS

| Number | Name | Date |
|---|---|---|
| 1,975,615 | Peterson | Oct. 2, 1934 |
| 1,987,867 | Peterson et al. | Jan. 15, 1935 |
| 2,012,497 | Clapp | Aug. 27, 1935 |
| 2,027,448 | Peterson | Jan. 14, 1936 |
| 2,220,956 | Hansell | Nov. 12, 1940 |